United States Patent [19]

Driscoll

[11] Patent Number: 5,519,359
[45] Date of Patent: May 21, 1996

[54] MICROWAVE OSCILLATOR WITH LOOP FREQUENCY CONVERSION TO AND SIGNAL AMPLIFICATION AT AN INTERMEDIATE FREQUENCY

[75] Inventor: Michael M. Driscoll, Ellicott City, Md.

[73] Assignee: Westinghouse Electric Corp., Pittsburgh, Pa.

[21] Appl. No.: 434,169

[22] Filed: Apr. 26, 1995

[51] Int. Cl.$^6$ ................................................ H03B 5/18
[52] U.S. Cl. ................................ 331/39; 331/41; 331/69; 331/96
[58] Field of Search .................... 331/37, 38, 39, 331/41, 42, 43, 96, 117 D, 69, 70

[56] References Cited

U.S. PATENT DOCUMENTS

| | | | |
|---|---|---|---|
| 4,245,193 | 1/1981 | Pan et al. | 331/39 |
| 4,757,278 | 7/1988 | Dick | 331/3 |

Primary Examiner—Siegfried H. Grimm
Attorney, Agent, or Firm—C. O. Edwards

[57] ABSTRACT

A microwave oscillator with loop frequency conversion to and signal amplification at an intermediate frequency. A high-Q sapphire dielectric resonator is coupled in a frequency conversion loop between a pair of balanced mixers. One mixer comprises a downconversion mixer from an output frequency $F_0$ to an intermediate frequency $F_{IF}$, while the other mixer comprises an upconversion mixer from the intermediate frequency $F_{IF}$ to the output frequency $F_0$. The frequency conversion loop additionally includes a low 1/f noise IF amplifier coupled between the mixers. The two mixers receive a local oscillator signal having a frequency $F_0 \pm F_{IF}$ from a microwave reference signal generator. In such an arrangement, an output frequency section and an intermediate frequency section is provided. The output frequency section includes the sapphire dielectric resonator and an output power divider while the intermediate frequency section includes the two mixers and the IF amplifier.

15 Claims, 2 Drawing Sheets

MICROWAVE OSCILLATOR WITH LOOP FREQUENCY CONVERSION TO AND SIGNAL AMPLIFICATION AT AN INTERMEDIATE FREQUENCY

BACKGROUND OF THE INVENTION

1. Field of the Invention

This invention relates generally to oscillator type electrical signal generators and more particularly to a microwave oscillator having a resonator portion operating at microwave frequencies and a signal amplification portion operating at an intermediate or IF frequency.

2. Background Art

There now exists a need in radar, communications and other types of electrical signal systems for highly stabilized oscillators which characteristically exhibit extremely low noise. Low noise performance typically requires some type of high Q circuit or some form of phase locking.

It is generally known that crystals, surface acoustic wave devices, bulk acoustic wave devices, inductance-capacitance and cavity resonators can be utilized to stabilize and control the oscillator. However, crystal and inductance-capacitance resonators normally have a low operation frequency and high instability due to mechanical vibration or jittering, respectively. Cavity resonators typically have a distinct limitation due to their relatively large physical size and the existence of multiple electromagnetic modes.

In an effort to increase the frequency of operation, UHF surface acoustic wave devices and bulk acoustic wave devices have recently been developed. It is known that bulk acoustic wave resonators can be made to operate in the GHz range; however, such structures support a train of discrete operating modes. One known technique for overcoming the undesirability of mode jumping has been achieved by high-Q multi-mode resonator controlled source having an oscillator sustaining stage circuit where the oscillator positive feedback loop contains a bulk acoustic wave resonator. The feedback loop circuit in such an oscillator includes a high and low frequency portion with the requisite frequency downconversion and upconversion being performed using separate frequency mixers whose local oscillator input drive are provided by an external signal generator. The high frequency portion of the loop, which includes the bulk acoustic resonator, operates at a desired output frequency which is equal to the sum of the local oscillator signal frequency and the frequency of the low frequency portion of the loop. A first mixer receives the output frequency and the local oscillator frequency and produces an IF frequency in the low frequency portion of the loop while a second mixer receives the frequency from the local oscillator and the IF frequency and produces an output of the output frequency in the high frequency portion of the loop. Thus as the local oscillator output frequency varies, the intermediate frequency in the low portion of the frequency loop varies inversely so that the up-down conversion performed by the system maintains the desired output frequency at a constant value. In order to prevent mode jumping, however, a narrow bandpass IF filter is connected in the low frequency portion of the loop.

In the prior art, signal amplification is provided in both the microwave and IF portions of the oscillator loop, and the narrow band IF filter is a requisite circuit element for prevention of mode jumping.

In the present invention, which also utilizes frequency conversion in the oscillator loop, the purpose of the embodiment of the circuit to be described is, specifically, to provide a low noise oscillator signal output by necessarily avoiding the use of both microwave signal amplification and narrow band IF filtering.

SUMMARY

Accordingly, it is an object of the present invention to provide an improvement in microwave oscillators.

It is another object of the present invention to provide an improvement in frequency stabilized microwave oscillators.

It is a further object of the present invention to provide improvement in stabilized oscillators which typically operate in the GHz frequency range.

It is yet another object of the present invention to provide a microwave oscillator having a loop frequency conversion to and signal amplification at an intermediate frequency.

It is still a further object of the present invention to provide a high-Q resonator controlled microwave oscillator which is not subject to frequency mode jumping and which provides enhanced noise suppression in the output signal.

The foregoing and other objects of the invention are achieved by a microwave oscillator comprised of: a local oscillator operating at microwave frequencies and generating a first output signal at a reference microwave frequency; a frequency conversion loop including an output frequency section and an intermediate frequency section; the output frequency section including a relatively high-Q single mode microwave resonator for providing a microwave output signal at a predetermined output frequency; the intermediate frequency section including downconversion means coupled to the local oscillator and the microwave resonator and being responsive to the output signals therefrom for generating an IF signal having a predetermined intermediate frequency; a 1/f low noise intermediate frequency (IF) amplifier coupled to the downconversion means for amplifying the IF signal; and upconversion means coupled to the intermediate frequency amplifier and the local oscillator and being responsive to an amplified IF signal and the output signal at the reference frequency for generating a microwave signal at the resonator's output frequency; the microwave signal at the resonator's output frequency being coupled back to the microwave resonator for providing a highly stable microwave output signal to a microwave signal output port.

In the preferred embodiment, the microwave resonator comprises a sapphire dielectric resonator operated at cryogenic temperatures and the intermediate frequency amplifier comprises a pair of cascaded silicon bipolar IF amplifiers.

BRIEF DESCRIPTION OF THE DRAWINGS

The following detailed description of the preferred embodiment of the invention will be more readily understood when considered together with the accompanying drawings wherein.

DETAILED DESCRIPTION OF THE INVENTION

Figure 1:
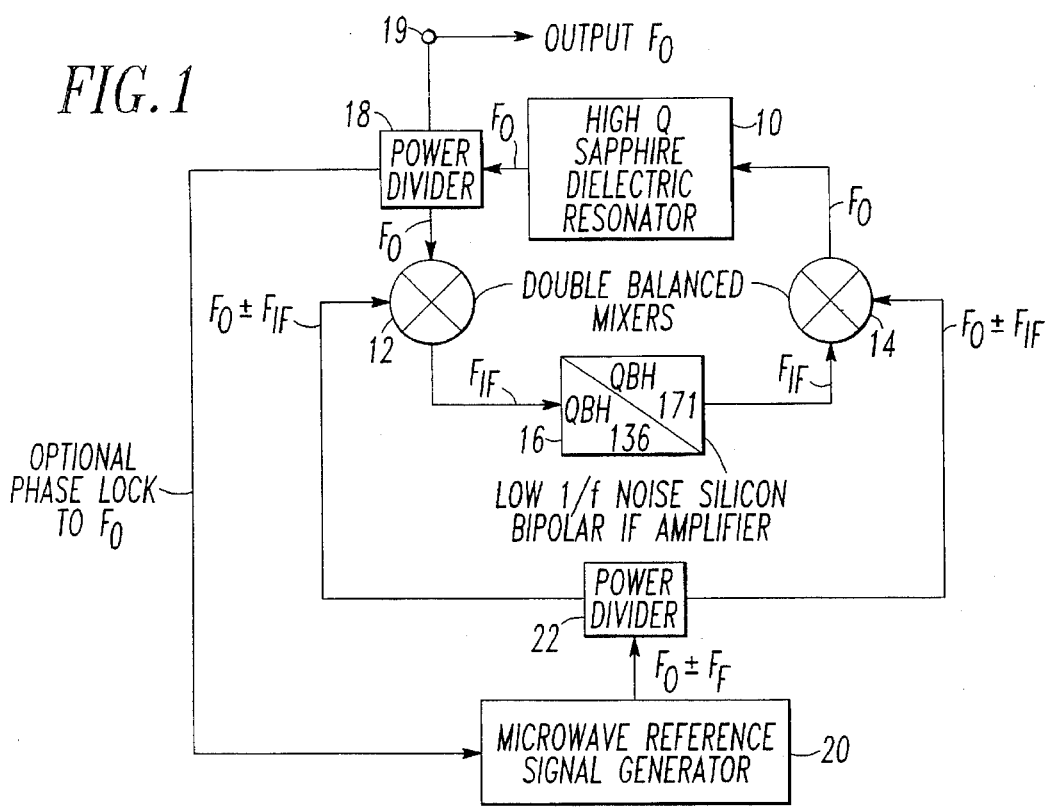
FIG. 1 is an electrical block diagram illustrative of the preferred embodiment of the invention.

Referring now to the figures and more particularly to FIG. 1, shown thereat is an electrical block diagram of the preferred embodiment of the invention and one which is directed to a microwave oscillator with loop frequency conversion to and signal amplification at an intermediate frequency.

As shown in FIG. 1, reference numeral 10 denotes a high-Q sapphire dielectric resonator which is coupled in a frequency conversion loop between a pair of balanced mixers 12 and 14. The mixer 12 comprises a downconversion mixer from an output frequency $F_0$ to an intermediate frequency $F_{IF}$, while mixer 14 comprises an upconversion mixer from the intermediate frequency $F_{IF}$ to the output frequency $F_0$. The frequency conversion loop additionally includes a low 1/f noise IF amplifier 16 and an output signal power divider 18 having an output port shown by reference numeral 19. The two mixers 12 and 14 receive a local oscillator signal having a frequency $F_0 \pm F_{IF}$ from a microwave reference signal generator 20 via a second power divider 22. In such an arrangement, an output frequency section and an intermediate frequency section is provided. The output frequency section includes the sapphire dielectric resonator 10 and the power divider 18 while the intermediate frequency section includes the downconversion mixer 12, the upconversion mixer 14 and the IF amplifier 16.

Figure 2:
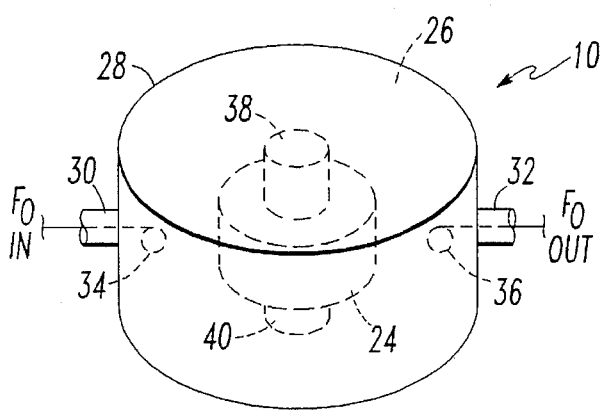
FIG. 2 is a perspective view generally illustrative of the high-Q sapphire dielectric resonator shown in FIG. 1.

Considering now the details of the resonator 10, it comprises a sapphire dielectric resonator operating at cryogenic temperatures. The resonator structure is shown in FIG. 2 and comprises a cylindrically shaped sapphire dielectric element 24 in the shape of a "puck" which operates on a high order TE mode; i.e. 5th order TE mode. The sapphire resonator element 24 is mounted within a cavity 26 bounded by a metallic cylindrical resonator housing 28 having input and output ports 30 and 32 which also include loop type signal couplers 34 and 36. The sapphire dielectric element 24 is supported within the resonator housing 28 by a pair of mounting spindles 38 and 40.

Figure 3:
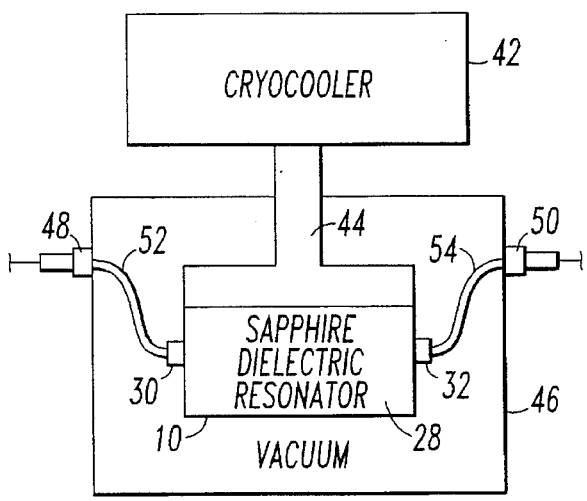
FIG. 3 is a mechanical schematic diagram further illustrative of the resonator shown in FIGS. 1 and 2 being operated at cryogenic temperatures.

In order for the sapphire dielectric resonator element 24 to operate at cryogenic temperatures, the cavity resonator housing 28 is shown in FIG. 3 being located in so as to be cooled by a cryogenic cooler 42 which also includes what is referred to as a "cold finger" member 44 which contacts the resonator housing 28. In order to maintain the cryotemperature of liquid nitrogen (77° Kelvin), the resonator housing 28 is located in a vacuum chamber 46 which includes a pair of coaxial connectors 48 and 50 connected to the input and output ports 30 and 32 by means of coaxial conductor members 52 and 54.

Figure 4:
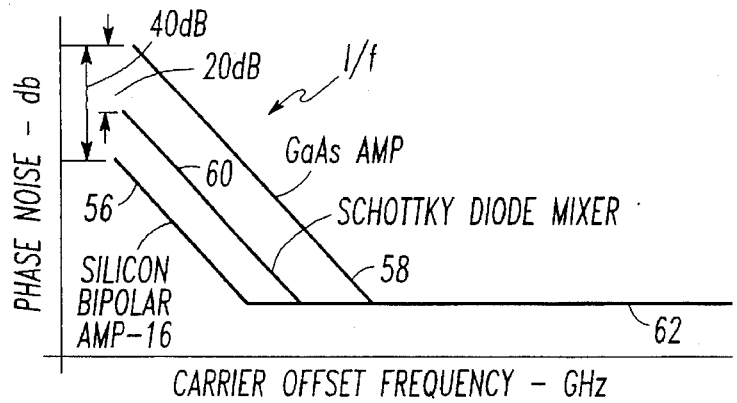
FIG. 4 is a graphical illustration of the phase noise vs. carrier frequency offset for different types of semiconductor devices.

The IF amplifier 16 shown in FIG. 1 comprises two cascaded silicon bipolar amplifiers manufactured, for example, by Q-BIT Corporation and identified by part Nos. QBH 136 and QBH 171. In the embodiment shown in FIG. 1, the QBH 136 amplifier feeds its output into the input of the QBH 171 amplifier. Such a configuration provides a low 1/f noise silicon bipolar IF amplifier configuration having a phase noise vs. carrier offset frequency characteristic such as shown by reference numeral 56 of FIG. 4 and which is shown contrasted with the characteristics of a gallium arsenide (GaAs) amplifier having a characteristic as shown by reference numeral 58 as well as a Schottky diode mixer having a characteristic as shown by reference numeral 60 and where reference numeral 62 represents the noise floor.

It can be seen that a GaAs microwave transistor amplifier exhibits a phase noise typically 40 dB higher than that of a silicon bipolar amplifier which is still 20 dB less than a Schottky diode mixer, for example. This is a significant advance in the art because it obviates the need for an IF bandpass filter in the intermediate section of the frequency conversion loop while still providing a significant improvement in output signal insensitivity to local oscillator signal noise/stability via use of low IF signal path delay which is relatively large when a narrow bandwidth IF filter is used.

The use of oscillator sustaining stage gain at a lower, i.e. IF frequency permits the use of silicon bipolar transistor amplifier(s) exhibiting significantly lower flicker-of-phase noise, compared to GaAs transistor microwave amplifiers. It is the sustaining stage amplifier flicker-of-phase noise that is converted to oscillator closed loop, flicker-of-frequency frequency noise and limits microwave oscillator near-carrier spectral performance. In addition, the FM/PM noise of the external signal generator used to accomplish signal downconversion and upconversion cancels, with the degree of cancellation equal to the ratio of microwave resonator group delay to IF signal path group delay.

Typical IF signal delay is on the order of 1 to 2 nsec. Typical high Q microwave resonator group delays are in the range 0.3 usec for conventional ceramic dielectric resonators to tens of microseconds for sapphire dielectric resonators operated at cryogenic temperatures. Therefore, 40 dB to 80 dB suppression of external signal generator FM/PM noise is obtainable by the microwave oscillator shown in FIG. 1.

This technique, moreover, is especially suited to low noise oscillators using, cooled sapphire dielectric resonator technology and results in a great degree of circuit simplification as compared to existing techniques incorporating feedback loops to suppress GaAs sustaining stage open loop phase noise and/or frequency stabilization of an external local oscillator. In addition, the local oscillator signal generator used for frequency conversion can be phase-locked, when desirable, to the oscillator signal to assure coherency between the two signals.

Figure 5:
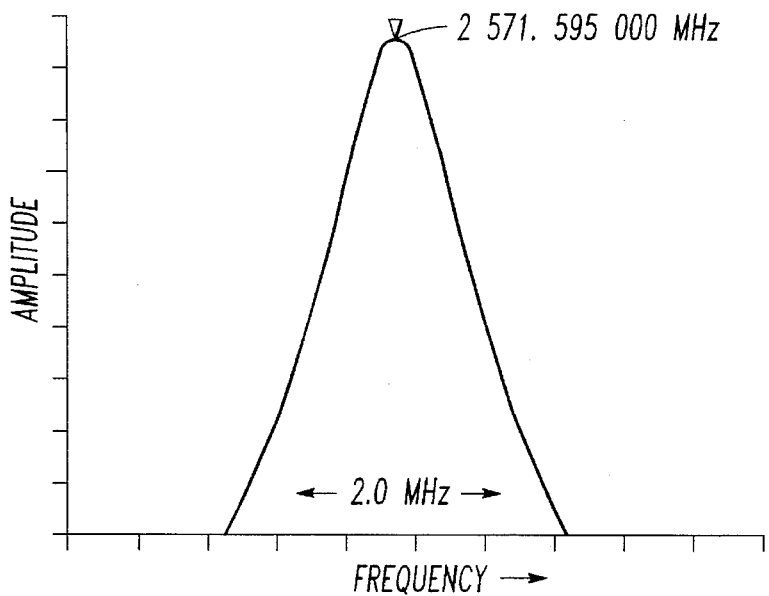
FIG. 5 is illustrative of the output frequency response provided by the embodiment shown in FIG. 1.
Figure 6:
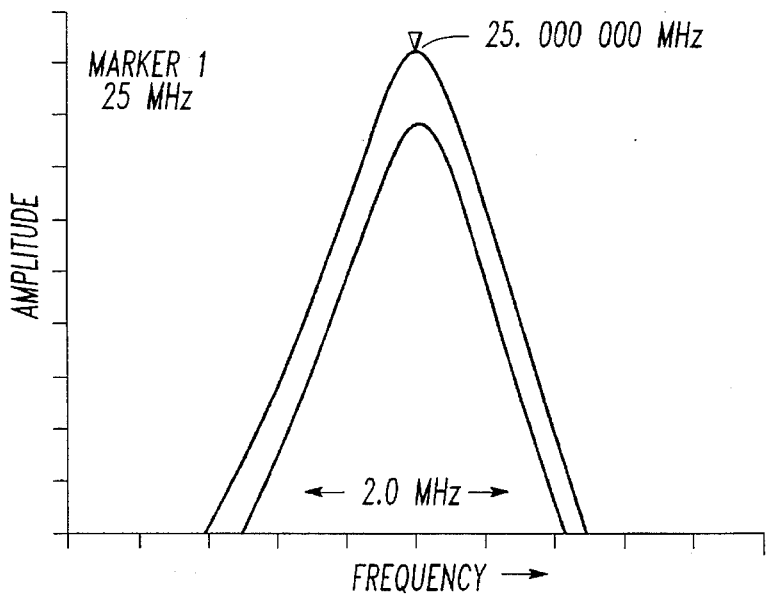
FIG. 6 is illustrative of the oscillator loop response for the embodiment shown in FIG. 1.

Thus in the subject invention there is a signal downconversion from the (microwave) resonator frequency to the sustaining stage intermediate frequency (IF) and a subsequent upconversion back up to microwave using a common external mixer local oscillator signal. Because of the steady-state oscillator closed loop requirement for $2N\pi$ radians phase shift, a change in the external mixer L.O. signal frequency results in an almost identical change in the IF frequency. The change in IF frequency results in a change in IF signal path phase shift due to the IF signal path group delay (phase vs. frequency slope) that is accompanied by a corresponding equal and opposite phase change in the microwave resonator signal path phase shift via an oscillator frequency change. The amount of frequency change is determined by the microwave resonator Q, and is typically orders of magnitude less than that of external L.O. signal frequency change, because the phase vs. frequency slope (group delay) of the resonator transmission response is much greater than that of the IF gain stage. In an actual physical implementation of the subject invention, where 2.545 GHz local oscillator frequency was used, a 2.57 GHz oscillator was constructed in accordance with the block diagram of FIG. 1. FIG. 5 shows the dielectric resonator output frequency response (loaded Q factor=7,000 at 5.5 dB insertion loss) at 2.57 GHz. FIG. 6 shows the oscillator loop response with the loop opened at the IF (25 MHz) signal path input. As shown in the figure, the resonator response appears relatively unchanged except for a slight Q degradation due to resonator load impedance (mixer) VSWR mismatch. Small signal excess gain is 1.3 dB with gain reduction to unity occurring due to amplifier gain compression at − 16 dBm IF signal input level. The effective resonator loop group delay is on the order of 800 nsec.

Having thus shown and described what is considered to be the preferred method and embodiment for implementing the subject invention, it is to be noted that the same has been made by way of illustration and not limitation. Accordingly, all modifications, alterations and changes coming within the spirit and scope of the invention are herein meant to be included.

I claim:

1. A microwave oscillator having loop frequency conversion to and signal amplification at an intermediate frequency while obviating the need for an amplifier in the microwave portion of a frequency conversion loop and a narrow band filter in the IF portion of the loop, comprising:

a local oscillator signal generator operating at microwave frequencies and generating an output signal at a reference microwave frequency;

a frequency conversion loop including a microwave frequency portion and an intermediate frequency portion;

said microwave frequency portion including relatively high Q single mode microwave resonator means for providing a microwave output signal at a predetermined output frequency;

said intermediate frequency portion including frequency downconversion means coupled to said local oscillator signal generator and said resonator means and being responsive to said output signal therefrom for generating an IF signal having a predetermined intermediate frequency;

relatively low noise intermediate frequency amplifier means coupled to said downconversion means for amplifying said IF signal; and upconversion means coupled to said intermediate frequency amplifier means and said local oscillator signal generator and being responsive to an amplified IF signal and said output signal generated by said local oscillator signal generator for generating a microwave signal at said predetermined output frequency, said microwave signal at said predetermined output frequency being coupled back to said microwave resonator means whereby a frequency stable microwave output signal is provided.

2. A microwave oscillator in accordance with claim 1 wherein said single mode microwave resonator means comprises a dielectric type resonator.

3. A microwave oscillator in accordance with claim 2 wherein said dielectric type resonator comprises a sapphire dielectric resonator operating at cryogenic temperatures.

4. A microwave oscillator in accordance with claim 3 wherein said sapphire dielectric resonator comprises a sapphire resonator element located in a resonator cavity structure having input and output signal couplers.

5. A microwave oscillator in accordance with claim 4 and additionally including cryogenic cooling apparatus in contact with said cavity structure.

6. A microwave oscillator in accordance with claim 1 wherein said intermediate frequency amplifier means includes silicon bipolar amplifier means.

7. A microwave oscillator in accordance with claim 1 wherein said intermediate frequency amplifier means includes a low 1/f noise silicon bipolar amplifier.

8. A microwave oscillator in accordance with claim 1 wherein said microwave resonator means comprises a sapphire dielectric resonator operated at cryogenic temperatures and wherein said intermediate frequency amplifier means comprises a low 1/f noise silicon bipolar amplifier.

9. A microwave oscillator in accordance with claim 8 and additionally including power divider means for commonly coupling said output signal at said reference frequency and generated by said local oscillator signal generator to said downconversion means and said upconversion means.

10. A microwave oscillator in accordance with claim 8 and additionally including power divider means for commonly coupling said microwave signal from said resonator means to said downconversion means and to an output signal port for said microwave signal.

11. A microwave oscillator in accordance with claim 9 and wherein said downconversion means and said upconversion means are comprised of respective signal mixers.

12. A microwave oscillator, comprising:

a local oscillator signal generator operating at microwave frequencies and generating an output signal at a reference microwave frequency;

a frequency conversion loop including a microwave frequency portion and an intermediate frequency portion;

said microwave frequency portion including a relatively high Q sapphire dielectric resonator operated at cryogenic temperatures for providing a microwave output signal at a predetermined output frequency;

said intermediate frequency portion including frequency downconversion means coupled to said local oscillator signal generator and said resonator, and being responsive to said output signals therefrom for generating an IF signal having a predetermined intermediate frequency;

relatively low 1/f noise silicon bipolar intermediate frequency amplifier means coupled to said downconversion means for amplifying said IF signal; and upconversion means coupled to said intermediate frequency amplifier means and said local oscillator signal generator and being responsive to said IF signal amplified by said intermediate frequency amplifier means and said output signal at said reference frequency from said local oscillator signal generator for generating a microwave signal at said predetermined output frequency, said microwave signal at said predetermined output frequency being coupled back to said sapphire dielectric resonator whereby a frequency stable microwave output signal is outputted from said resonator without the need for an amplifier in the microwave portion of the loop or a narrow band filter in the IF portion of the loop.

13. A microwave oscillator in accordance with claim 12 and additionally including power divider means for commonly coupling said output signal at said reference frequency to said downconversion means and said upconversion means.

14. A microwave oscillator in accordance with claim 12 and additionally including power divider means for commonly coupling said microwave output signal at said predetermined output frequency from said resonator to said downconversion means and to an output signal port.

15. A microwave oscillator in accordance with claim 12 and wherein said downconversion means and said upconversion means comprise a pair of double balanced mixers.

* * * * *